United States Patent
Bengoechea De La Llera et al.

(10) Patent No.: US 10,241,138 B2
(45) Date of Patent: Mar. 26, 2019

(54) CURRENT MEASURING EQUIPMENT AND METHODS

(71) Applicant: LUMIKER APLICACIONES TECNOLOGICAS S.L., Derio (ES)

(72) Inventors: Francisco Javier Bengoechea De La Llera, Loiu (ES); Myriam Consuelo Garcia Carromero, Madrid (ES)

(73) Assignee: LUMIKER APLICACIONES TECNOLOGICAS S.L., Derio (ES)

( * ) Notice: Subject to any disclaimer, the term of this patent is extended or adjusted under 35 U.S.C. 154(b) by 0 days.

(21) Appl. No.: 15/819,786

(22) Filed: Nov. 21, 2017

(65) Prior Publication Data

US 2018/0095113 A1  Apr. 5, 2018

Related U.S. Application Data

(63) Continuation of application No. PCT/EP2016/063261, filed on Jun. 10, 2016.

(30) Foreign Application Priority Data

Jun. 10, 2015 (EP) .................................. 15382303

(51) Int. Cl.
*G01R 15/24* (2006.01)
*G01R 19/00* (2006.01)
*G01R 33/032* (2006.01)

(52) U.S. Cl.
CPC ....... *G01R 15/246* (2013.01); *G01R 19/0092* (2013.01); *G01R 33/0322* (2013.01)

(58) Field of Classification Search
CPC .. G01R 33/02; G01R 33/032; G01R 33/0322; G01R 19/0092; G01R 15/14;

(Continued)

(56) References Cited

U.S. PATENT DOCUMENTS 6,670,799 B1 * 12/2003 Bull .................... G01R 15/181
                                              324/127
2002/0027659 A1 * 3/2002 Dyott .................. G01R 15/246
                                              356/483

(Continued)

FOREIGN PATENT DOCUMENTS

EP    2407792 A1   1/2012
WO    0019217 A1   4/2000
WO    0026682 A1   5/2000

OTHER PUBLICATIONS

European Search Report in corresponding European Patent Application No. 15382303.4, dated Feb. 24, 2016.

(Continued)

*Primary Examiner* — Huy Q Phan
*Assistant Examiner* — David Frederiksen
(74) *Attorney, Agent, or Firm* — Edell, Shapiro & Finnan, LLC

(57) ABSTRACT

Optical fiber based current measuring equipment for measuring the current circulating through a conductor. The equipment includes an interrogator having a light emitter and a light receiver, and a sensing portion close to the conductor, the interrogator and the sensing portion being connected through at least one standard single-mode intermediate fiber. The light emitter of the interrogator is configured to emit sets of at least two polarized light pulses to the sensing portion, the pulses being polarized with a specific degree difference, and the light receiver (4) is configured to determine the current circulating through the conductor depending on the pulses it receives in return from the sensing portion. A method for measuring the current circulating through a conductor with the use of an optical fiber based current measuring equipment is also provided.

29 Claims, 4 Drawing Sheets

(58) Field of Classification Search
CPC .... G01R 15/24; G01R 15/245; G01R 15/246; G01R 15/247
See application file for complete search history.

(56) References Cited

U.S. PATENT DOCUMENTS

| | | |
|---|---|---|
| 2004/0160608 A1 | 8/2004 | Bohnert et al. |
| 2005/0281560 A1* | 12/2005 | Kern .................... G01R 15/248 398/149 |
| 2006/0126990 A1* | 6/2006 | Deng ................... G01R 15/245 385/12 |
| 2011/0115469 A1 | 5/2011 | Kondo et al. |
| 2012/0007584 A1* | 1/2012 | Sanders ............... G01R 15/246 324/96 |
| 2012/0091991 A1* | 4/2012 | Konno ................. G01R 15/246 324/95 |
| 2012/0121216 A1 | 5/2012 | Oh |
| 2012/0286767 A1 | 11/2012 | Chamorovskiy et al. |
| 2016/0033556 A1* | 2/2016 | Mueller ............... G01R 15/246 324/96 |

OTHER PUBLICATIONS

International Search Report in corresponding PCT Application No. PCT/EP2016/063261, dated Sep. 22, 2016.

\* cited by examiner

CURRENT MEASURING EQUIPMENT AND METHODS

CROSS-REFERENCE TO RELATED APPLICATIONS

This application relates to and claims the benefit and priority to International Application No. PCT/EP2016/063261, filed Jun. 10, 2016, which claims the benefit and priority to European Application No. 15382303.4, filed Jun. 10, 2015, each of which is incorporated by reference herein in its entirety . . . .

FIELD

The present invention relates to a current measuring equipment based on optical fiber for measuring the current circulating through a conductor, and to a method for measuring the current circulating through a conductor with a current measuring equipment based on optical fiber.

BACKGROUND

Sensors based on optical fiber for measuring the current circulating through a conductor are known. Said sensors work according to the Faraday Effect, i.e., the magnetic field generated by the current circulating through the conductor causes a rotation in the polarization of light circulating through the optical fiber arranged around the conductor. The operation of a measuring equipment based on optical fiber consists of emitting light through an optical fiber towards a sensing portion in which the characteristics of the light are modified depending on the current circulating through the conductor, and analyzing the rotation caused in the polarization of light to determine the magnitude of the current passing through the conductor.

Current measuring equipment based on optical fiber in which the components forming the equipment are arranged in the proximity of the conductor, the sensing of which is to be achieved are known. For example, patent documents US20120286767A1 and WO2000026682A1 disclose current measuring equipment of this type. When the conductor, the sensing of which is to be achieved is arranged in a remote location, arranging all the elements making up the measuring equipment in said location can be a drawback, since some of the components forming the measuring equipment must be powered, for example.

In addition, current measuring equipment based on optical fiber in which the sensing portion and the rest of the measuring equipment are arranged spaced apart from and joined to one another by an intermediate fiber of indefinite length are also known. For example, patent document US20110115469A1 describes current measuring equipment comprising a light source emitting light towards a sensing portion through a standard single-mode fiber. The sensing portion comprises a sensing fiber wound around the conductor and a mirror on which the light is reflected. For the return of the light the sensor comprises, at the outlet of the sensing portion, a polarization splitter splitting the light in two components the polarizations of which are perpendicular. Each component is depolarized and then emitted through two intermediate fibers, one for each component, towards a respective photodetector. Splitting the light in two polarized components and subsequently depolarizing same, seeks to compensate for the alterations that can be caused by the intermediate fiber.

SUMMARY OF THE DISCLOSURE

A first aspect relates to current measuring equipment based on optical fiber comprising an interrogator with an emitter and a receiver, and a sensing portion close to the conductor. The interrogator and the sensing portion are suitable for being connected through at least one standard single-mode intermediate fiber. The emitter of the interrogator is suitable for emitting sets of at least two polarized light pulses to the sensing portion, said pulses being polarized with a specific degree difference. The receiver is suitable for determining the current circulating through the conductor depending on the pulses it receives in return from the sensing portion.

A second aspect relates to a method for measuring the current circulating through a conductor with a current measuring equipment based on optical fiber.

The standard single-mode fiber used for joining the interrogator with the sensing portion can change the characteristics of the light signal emitted from the emitter, for example, in the polarization thereof. Said intermediate fiber can modify the polarization of light due to different aspects such as the temperature of said fiber, the vibrations it suffered, etc. The action of emitting sets of at least two polarized light pulses, said pulses being polarized with a specific degree difference, means that the measuring equipment can compensate for the alterations produced by the intermediate fiber.

Since the characteristics of the intermediate fiber do not affect current measurement, an intermediate fiber having the necessary length can be used. Therefore, it is possible to arrange the sensing portion and the interrogator at a distance of several kilometers without the measurement being affected by said intermediate fiber. The current of the conductors located in remote locations can thereby be measured without having to place the interrogator in said locations, in which the requirements necessary for the operation of said interrogators may not be complied with, for example, the unavailability of reliable power supply.

Furthermore, using a single intermediate fiber is sufficient for joining the sensing portion and the interrogator. This is due to the action of sending sets of pulses that comply with the mentioned requirements which allow compensating for the changes that can be caused by the intermediate fiber.

These and other advantages and features will become evident in view of the drawings and the detailed description.

DETAILED DESCRIPTION

Figure 1:
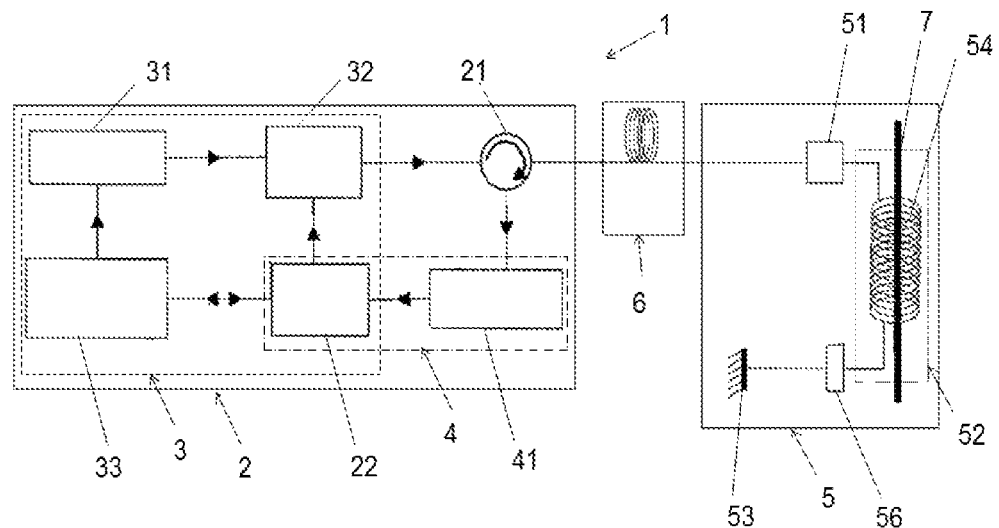
FIG. 1 schematically shows a current measuring equipment based on optical fiber according to a first embodiment.

FIG. 1 shows a first embodiment of the current measuring equipment based on optical fiber 1 for measuring the current circulating through a conductor 7.

The current measuring equipment 1 comprises an interrogator 2 with an emitter 3 and a receiver 4 and a sensing portion 5 close to the conductor 7. The interrogator 2 and the sensing portion 5 are configured for being connected through a standard single-mode intermediate fiber 6.

In this embodiment, the interrogator 2 comprises a rotator 21 the function of which consists of coupling the signal emitted by the emitter 3 to the intermediate fiber 6 and coupling the modified signal in the sensing portion 5 from the intermediate fiber 6 to the receiver 4.

The current measuring equipment 1 is designed such that the influence of the standard single-mode intermediate fiber 6 can be eliminated. The current measuring equipment 1 can therefore use standard single-mode fibers already installed for other uses and the intermediate fiber 6 can be of the desired length. As described above, when the current of a conductor 7 which is arranged in a remote location is to be measured, the interrogator 2 can be arranged in a location where there is reliable power supply. The equipment of the interrogator 2 can therefore be arranged in a suitable location, being able to be several kilometers in distance from the sensing portion 5.

The emitter 3 of the interrogator 2 is suitable for emitting sets of at least two polarized light pulses to the sensing portion 5, said pulses being polarized with a specific degree difference. The emitter 3 is preferably suitable for emitting sets of two polarized light pulses, said pulses being polarized with a 90-degree difference.

The receiver 4 is suitable for determining the current circulating through the conductor 7 depending on the pulses it receives in return from the sensing portion 5.

In this first embodiment, the emitter 3 comprises a light source 31 and an optical circuit 32. The light source 31 is preferably a polarized laser with modulation capacity. In other possible embodiments, other light sources can be used.

FIGS. 2 to 5 show different embodiments of the optical circuit 32 of the emitter 3 of this first embodiment of the current measuring equipment 1. In all of them, the objective is to emit sets of two polarized light pulses, said pulses being polarized with a 90-degree difference.

Figure 2:
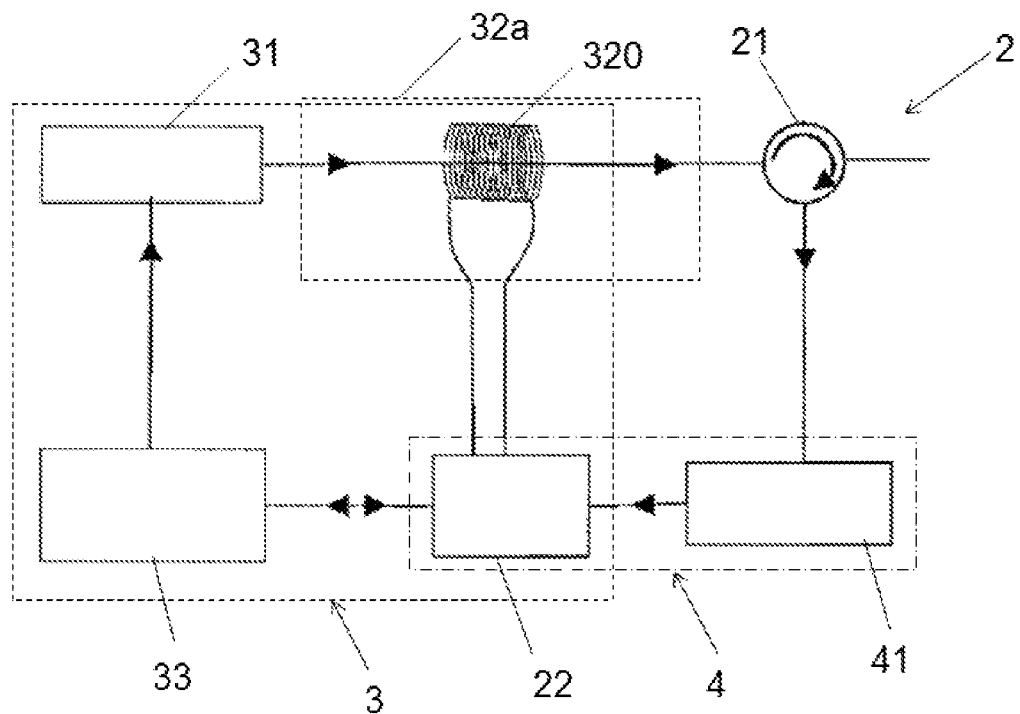
FIG. 2 shows the emitter of the current measuring equipment of FIG. 1 with a first embodiment of the optical circuit.

The embodiment of the optical circuit 32a shown in FIG. 2 comprises a branch in which a Faraday rotator 320 controlled by a control unit 22 is arranged. In this embodiment, the Faraday rotator 320 comprises a coil which can be powered by the control unit 22, but in other embodiments the Faraday rotator can be carried out in any other mode known for the person skilled in the art. As mentioned above, the light source 31 preferably emits polarized light, for example, light polarized at 0 degrees. The operation of the emitter 3 of this embodiment is described below.

The control unit 22 instructs a square wave generator 33 to feed the light source 31 so that it emits a first pulse, in which the coil of the rotator is not powered. The control unit 22 then instructs the square wave generator 33 to feed the light source 31 so that it emits a second pulse, in this case the coil being powered with a current such that it causes a 90-degree rotation in the polarization of the pulse.

In this embodiment there will be a time interval between the pulses emitted by the emitter 3. The polarized light pulses of the set of pulses must be emitted with a small time interval between said pulses, since this thereby assures that the behavior of the intermediate fiber 6 is the same for all the pulses of the set of pulses. The time gap between the pulses must be sufficient so that there is no overlapping between them in any part of the measuring equipment.

Figure 3:
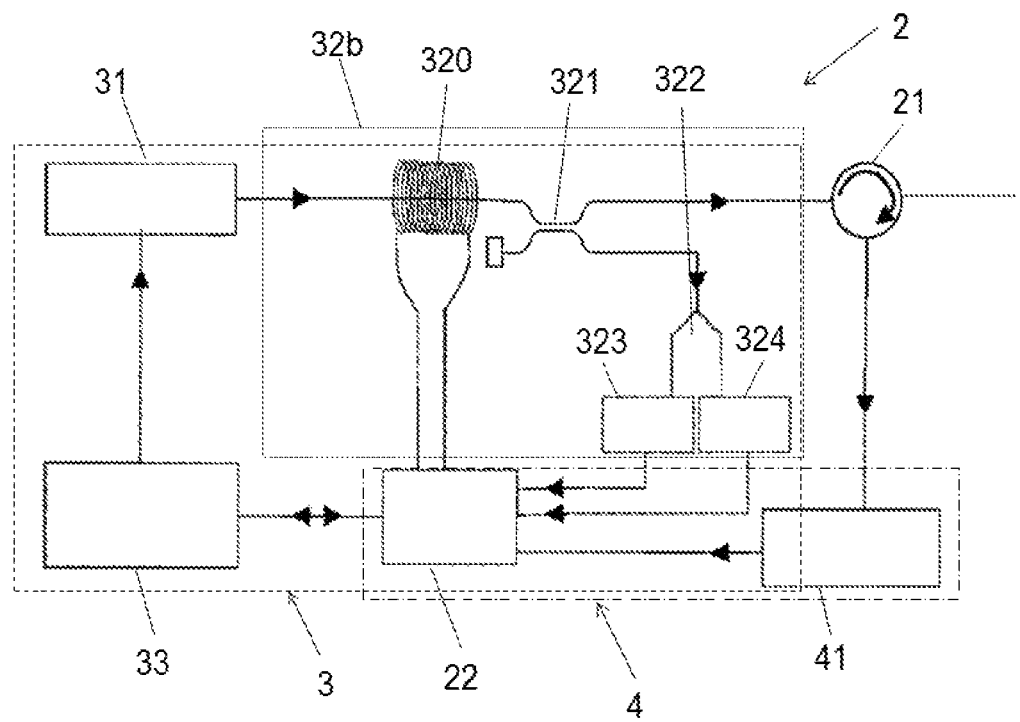
FIG. 3 shows the emitter of the current measuring equipment of FIG. 1 with a second embodiment of the optical circuit.

The embodiment of the optical circuit 32b shown in FIG. 3 differs from the embodiment of FIG. 2 in that it is a closed loop circuit. The circuit comprises a coupler 321 arranged before the rotator 21, one of the output branches of the coupler 321 being joined to the rotator 21 and the other output branch being joined to a polarizer 322 splitting the signal in two orthogonal polarizations that are connected to a respective photodiode 323 and 324. The control unit 22 can therefore adjust the current being fed to the coil of the Faraday rotator 320 to achieve two pulses with the desired polarization phase shift.

Figure 4:
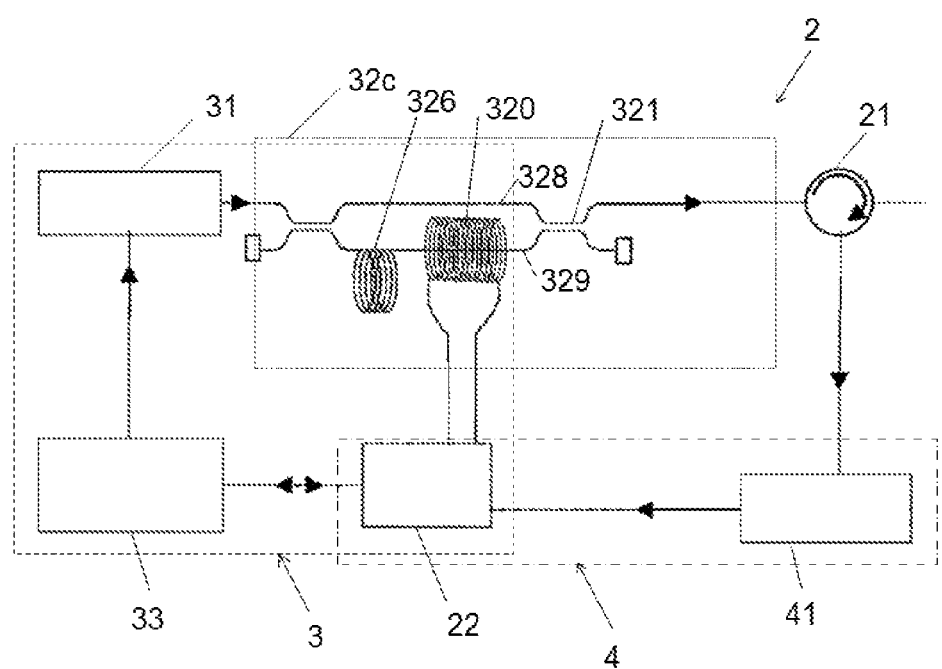
FIG. 4 shows the emitter of the current measuring equipment of FIG. 1 with a third embodiment of the optical circuit.

The embodiment of the optical circuit 32c shown in FIG. 4 comprises two branches, one of said branches comprising a delayer 326 and a Faraday rotator 320. The optical circuit 32 comprises a first coupler 327, one of the inputs of the coupler being connected to the light source 31 and each of its outputs being connected to a respective branch 328 and 329 of the optical circuit 32c. The optical circuit 32c comprises a second coupler 321, its inputs being connected to a branch 328 and 329 of the optical circuit and one of its outputs being connected to the rotator 21. The operation of the emitter 3 of this embodiment is described below.

The control unit 22 instructs the square wave generator 33 to feed the light source 31 so that it emits a pulse which is split through the first coupler 327 in the two branches 328 and 329 of the optical circuit. The pulse of the first branch 328 is directly directed towards an input of the second coupler 321 whereas the pulse of the second branch 329 goes through an extra section of optical fiber 326 for delaying the pulse of the second branch 329 with respect to that of the first branch 328 and the polarization thereof is then rotated 90 degrees powering the coil of the Faraday rotator 320 with the suitable current, the delayed and rotated pulse entering the other input of the second coupler 327. One of the outputs of the second coupler is connected to the rotator 21.

In another possible embodiment, not shown in the figures, the optical circuit of the previous embodiment could work without the delayer. In this case, the set of pulses would comprise two simultaneous pulses, said pulses being polarized with a 90-degree difference. In said embodiment, it is compulsory that both pulses have the same power.

Figure 5:
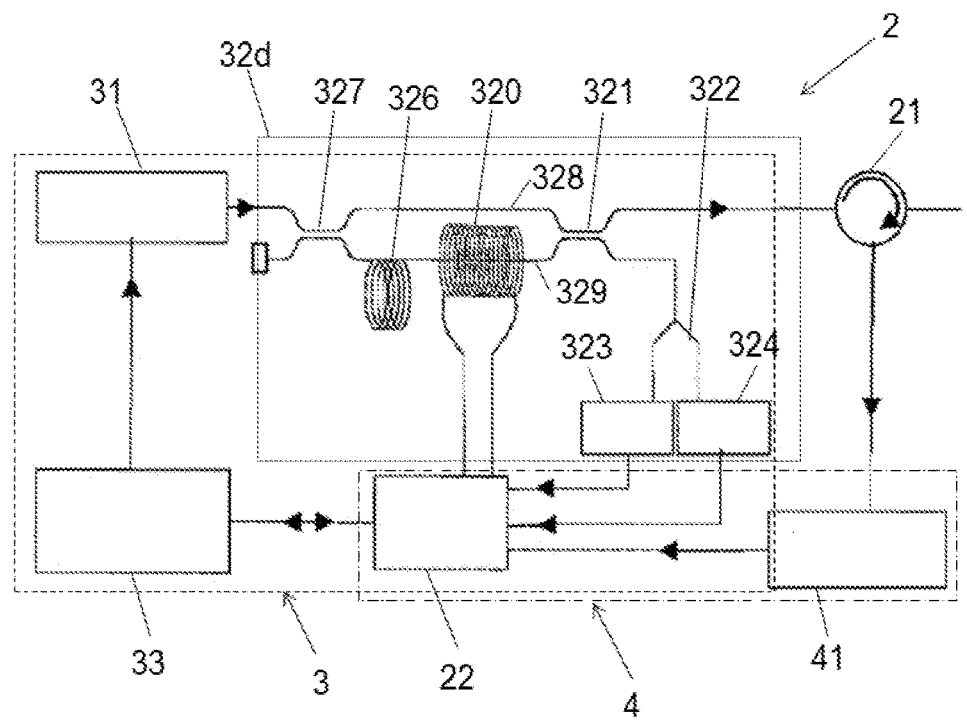
FIG. 5 shows the emitter of the current measuring equipment of FIG. 1 with a fourth embodiment of the optical circuit.

The embodiment of the optical circuit 32d shown in FIG. 5 differs from that shown in FIG. 4 in that the optical circuit is in a closed loop, the operation of the closed loop would be the same as that FIG. 3, in which the control unit 22 can adjust the current being fed to the coil of the Faraday rotator 320 to achieve a set of pulses having the desired characteristics.

As for the embodiment shown in FIG. 4, in another possible embodiment, not shown in the figures, the optical circuit of the embodiment shown in FIG. 5, could work without the delayer. In this case, the set of pulses would comprise two simultaneous pulses, said pulses being polarized with a 90-degree difference. In said embodiment, it is compulsory that both pulses have the same power.

As mentioned above, the light source used and the embodiment of the optical circuit can be carried out in any other mode known by the person skilled in the art provided that sets of pulses having the desired characteristics are successfully emitted.

Figure 6:
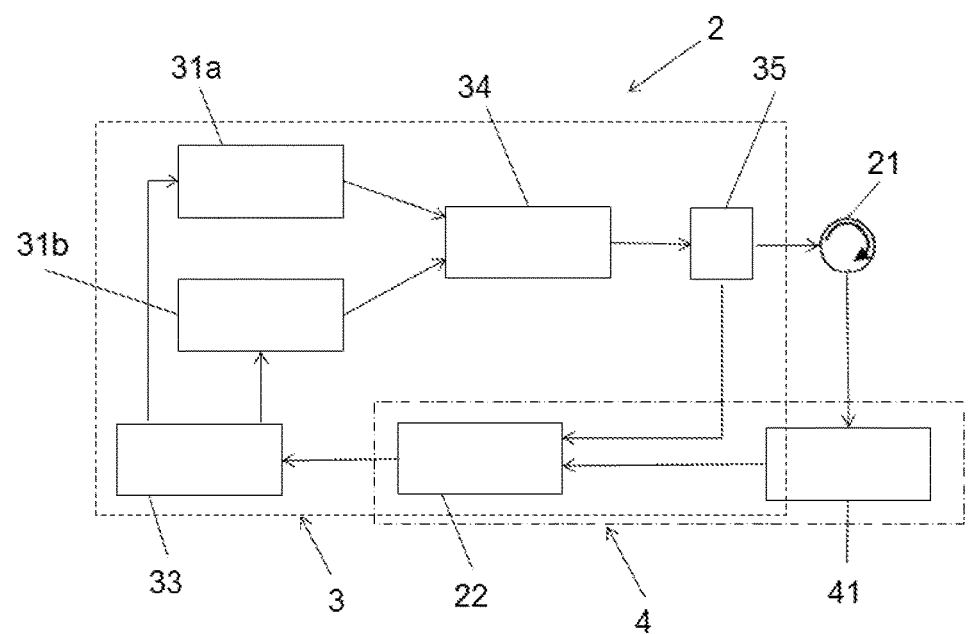
FIG. 6 schematically shows the emitter of the current measuring equipment based on optical fiber according to another embodiment.

For example, FIG. 6 shows one embodiment of the emitter using two light sources 31a and 31b which are coupled to a combiner 34 having two input polarizers and one output in the form of single-mode fiber. This combiner 34 combines what comes from each of its two polarizers into a single signal, respecting the polarity thereof. In order to know and adjust the amount provided by each light source 31a and 31b, as well as the possible imperfections in the coupling between the light sources 31a and 31b and the combiner 34, a photodiode 35 is arranged which determines the output power.

In the first embodiment of the measuring equipment 1 shown in FIG. 1, the sensing portion 5 comprises a linear polarizer 51 filtering the input signal allowing only a specific oscillation direction of the electric field of the light to go through. The linear polarizer 51 preferably only allows the part of the signal oscillating at 0 degree to go through.

As described above, the emitter emits sets of two pulses with a 90-degree difference in polarization. Therefore, if due to the influence of the intermediate fiber 6 on the emitted light, one of the pulses becomes perpendicular or almost perpendicular to the 0-degree axis and said pulse is therefore lost, the other pulse of the set which is emitted with a 90-degree difference in polarization assures that this pulse will go through. The measuring equipment therefore works correctly despite the fact that the intermediate fiber 6 modifies the characteristics of the emitted set of pulses.

In this first embodiment, the sensing portion 5 comprises a sensing section 52 after the linear polarizer 51 in which the polarization of the pulses changes depending on the magnetic field generated by the current circulating through the conductor 7. Specifically, in this first embodiment the sensing section 52 comprises an optical fiber winding 54 suitable for being arranged around the conductor 7, the optical fiber of the winding 54 corresponding with the optical fiber through which the light pulses circulate.

Furthermore, in this first embodiment the sensing portion 5 comprises a reflective mirror 53 after the sensing section 52.

In this first embodiment, the sensing portion 5 comprises a Faraday rotator 56 arranged between the linear polarizer 51 and the reflective mirror 53, preferably a Faraday rotator 56 rotating the polarization of light 22.5 degrees at room temperature. The Faraday rotator 56 can be carried out in different forms known by the person skilled in the art, such as for example, a magnet arranged around the optical fiber. This rotator, according to the calculations performed, simplifies the signal recovery process in the receiver, maximizing equipment sensitivity.

In this embodiment, all the components of the sensing portion 5 are passive components. It is therefore not necessary for the location in which the sensing portion 5 is arranged to have power supply.

In this first embodiment, the receiver 4 comprises a photodiode 41. The photodiode 41 is suitable for receiving the set of pulses modified in the sensing portion 5 through the intermediate fiber 6 and the rotator 21. The photodiode 41 converts light into intensity. The control unit 22 can determine the current circulating through the conductor 7 by processing the signal it receives from the photodiode 41.

As a final result of the passage of the light pulses from the emitter 3 to the sensing portion 5 and the other way around from the sensing portion 5 to the receiver 4, considering at least two pulses shifted 90° and with the power factor corrections associated with each pulse, the signal received in the photodiode 41 would be equivalent to:

$$\cos^2 2\theta \cos^2 2\theta_i + \sen^2 2\theta \sen^2 2\theta_i - 2\cos 2\theta \sin 2\theta \cos 2\theta_i \sen 2\theta_i$$

The $\theta$ value corresponds with the degrees at which the Faraday rotator 56 rotates the polarization of light pulses, being 22.5 degrees at room temperature in this first embodiment.

The $\theta_i$ value would hold the information about the current circulating through the conductor 7.

Figure 7:
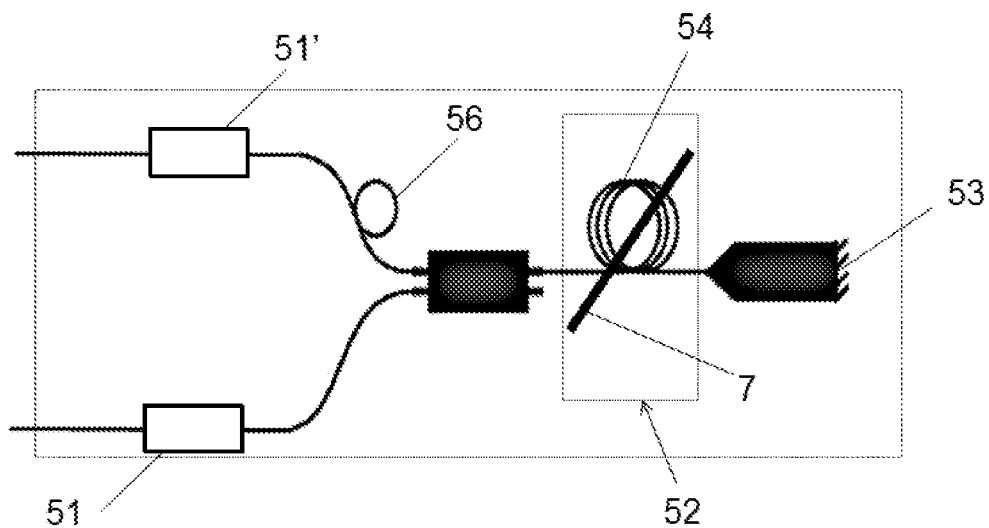
FIG. 7 schematically shows another embodiment of the sensing portion of the current measuring equipment based on optical fiber.

FIG. 7 shows another embodiment of the sensing portion 5 of the current measuring equipment 1 according to the invention. This embodiment of the sensing portion 5 can be combined with any of the embodiments of the interrogator 2 described above.

This embodiment differs from the embodiment shown in FIG. 6 in that the sensing portion 5 comprises a first branch wherein a polarizer 51 is disposed and a second branch wherein a rotator 56 and a second polarizer 51' are disposed. The first and the second branches are connected to a sensing section 52 with a coupler 50. The sensing portion 5 also comprises a reflective mirror 53 after the sensing section 52. The characteristics of the sensing section 52 are the same as in the previous embodiment. Preferably the rotator 56 rotates the polarization of light 45 degrees at room temperature.

The sensing portion 5 of this embodiment can be connected to the interrogator 2 in different modes.

A first mode is to dispose another coupler to connect the two branches of the sensing portion 5 to the intermediate fiber 6. A second mode is to connect the interrogator 2 and the sensing portion 5 through two standard single-mode intermediate fibers 6. In this case, the emitter 3 would be connected to the first branch of the sensing portion 5 through a first standard single-mode intermediate fiber 6, and the receiver 4 would be connected to the second branch of the sensing portion 5 through a second standard single-mode intermediate fiber 6.

Figure 8:
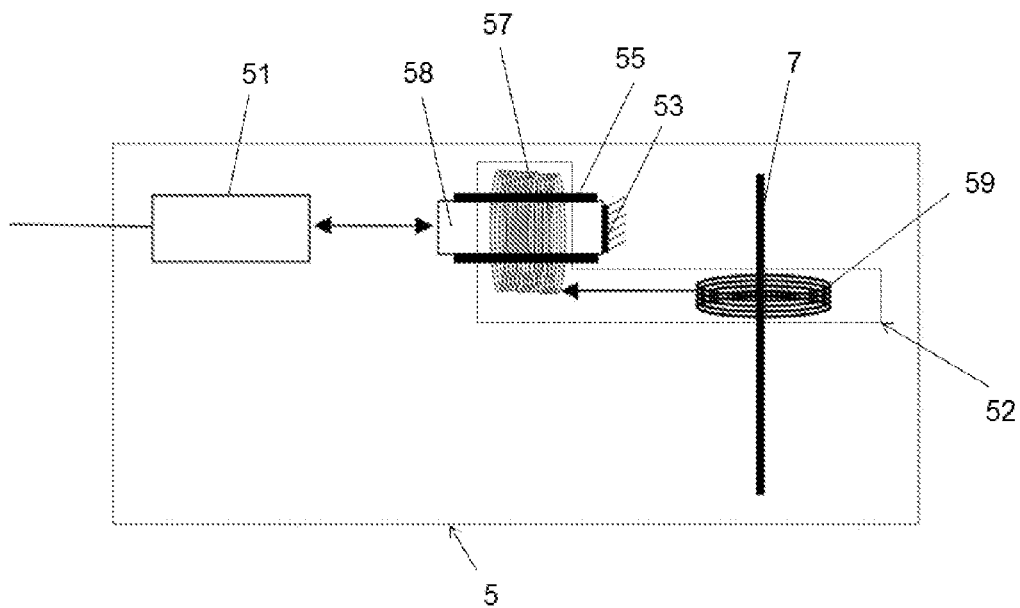
FIG. 8 schematically shows another embodiment of the sensing portion of the current measuring equipment based on optical fiber.

FIG. 8 shows another embodiment of the sensing portion 5 of the current measuring equipment 1. This embodiment of the sensing portion 5 can be combined with any of the embodiments of the interrogator 2 described above.

In this embodiment, the sensing portion 5 comprises a linear polarizer 51 filtering the input signal allowing only a specific oscillation direction of the electric field of the light to go through.

Furthermore, in this embodiment the sensing section 52 comprises an optical element with a glass 58 and a magnet 55 arranged around the glass 58, and a coil 57 generating a field proportional to the current circulating through the conductor 7, since a conventional current transformer 59 feeding said coil 57 has been installed. Furthermore, the magnet 55 is suitable for causing an extra 22.5 degree rotation in the polarization of light. This fixed rotation occurs at room temperature, being able to vary slightly with the change in temperature. The optical element also comprises a mirror 53 suitable for reflecting the set of pulses. In this embodiment, the $\theta_i$ generated by the presence of the magnetic field, is produced within the optical glass, which has a very high Verdet constant value.

The method for measuring the current circulating through a conductor 7 with a current measuring equipment based on optical fiber 54 such as those described above comprises the following steps:

a pulse transmission step in which the emitter 3 emits a set of at least two polarized light pulses with a specific degree difference, which pulses reach the sensing portion 5 through the intermediate fiber 6, a sensing step in which the pulses run through the sensing portion 5 and are modified depending on the current circulating through the conductor 7, and a current determination step in which the receiver 4 receives from the sensing portion 5 and through the intermediate fiber 6 the pulses modified in the sensing portion 5 and, depending on the strength thereof, determines the current circulating through the conductor 7.

In an embodiment there is a time interval between the pulses of the set of pulses.

In the embodiments described above in the transmission step the emitter emits sets of two polarized light pulses, said pulses being polarized with a 90-degree difference.

In the described embodiments, the sensing step has the following substeps:

an outward linear polarization substep in which the pulses received through the intermediate fiber 6 are linearly polarized, an outward variable rotation substep in which the pulses go through the sensing section 52 rotating the polarization of said pulses depending on the current circulating through the conductor, a reflection substep in which the pulses are reflected in the mirror 53, a return variable rotation substep in which the pulses again go through the sensing section 52 rotating the polarization of said pulses depending on the current circulating through the conductor, and a return linear polarization substep in which the pulses are linearly polarized.

Furthermore, in the embodiments shown in FIGS. 1 and 8 the sensing step comprises an outward fixed rotation substep and a return fixed rotation substep in which the pulses go through a Faraday rotator 56 and are rotated a specific fixed angle, such as 22.5 degrees.

In the embodiment shown in FIG. 7 the sensing step comprises a return fixed rotation substep in which the pulses go through a rotator 56 and are rotated a specific fixed angle, such as 45 degrees.

What is claimed is:

1. An optical fiber based current measuring equipment for measuring a current circulating through a conductor, the current measuring equipment comprising:
   an interrogator including a light emitter and a light receiver; and
   a sensing portion located in proximity to the conductor, the sensing portion including an optical element that is optically coupled to the light emitter and to the light receiver, the interrogator and the sensing portion being connected through at least one single-mode intermediate fiber,
   the light emitter being configured to emit sets of at least first and second polarized light pulses to the sensing portion, the first polarized light pulse having a first polarization and the second polarized light pulse having a second polarization that is different than the first polarization,
   the light receiver being configured to determine the current circulating through the conductor based on light pulses received from the sensing portion in response to the first and second polarized light pulses delivered to the sensing portion.

2. The current measuring equipment according to claim 1, wherein the optical element is an optical fiber.

3. The current measuring equipment according to claim 1, wherein the optical element comprises a glass element.

4. The current measuring equipment according to claim 1, wherein the polarization of the first and second polarized light pulses differ by 90 degrees.

5. The current measuring equipment according to claim 1, wherein the light emitter is configured to emit the first and second polarized light pulses so that a time interval exists between the first and second polarized light pulses.

6. The current measuring equipment according to claim 4, wherein the light emitter is configured to emit the first and second polarized light pulses so that a time interval exists between the first and second polarized light pulses.

7. The current measuring equipment according to claim 5, wherein the light emitter includes a light source that is capable of modulating an amplitude of light generated by the light source.

8. The current measuring equipment according to claim 7, wherein the light emitter comprises an optical circuit having at least one branch in which a Faraday rotator is arranged, the optical circuit being arranged between the light source and the sensing portion.

9. The current measuring equipment according to claim 1, wherein the light emitter comprises a light source that is capable of modulating an amplitude of light generated by the light source.

10. The current measuring equipment according to claim 2, wherein the sensing portion comprises:
    a sensing section comprising the optical fiber, the optical fiber having a first end and a second end,
    a linear polarizer optically coupled to the first end of the optical fiber,
    a reflective mirror optically coupled to the second end of the optical fiber,
    the sensing portion configured such that when the first and second polarized light pulses are passed through the optical fiber the polarization of the first and second polarized light pulses changes depending on a magnetic field generated by the current circulating through the conductor.

11. The current measuring equipment according to claim 10, wherein the optical fiber spirals around the conductor.

12. The current measuring equipment according to claim 3, wherein the sensing section further comprises a coil through which the glass element is passed and suitable for generating a magnetic field proportional to that generated by the conductor such that the magnetic field generated by the coil rotates the polarization of the first and second polarized light pulses.

13. The current measuring equipment according to claim 10, wherein the sensing portion comprises a Faraday rotator optically arranged between the second end of the optical fiber and the reflective mirror.

14. The current measuring equipment according to claim 10, wherein the sensing portion comprises a Faraday rotator optically arranged between the linear polarizer and the first end of the optical fiber.

15. The current measuring equipment according to claim 13, wherein the Faraday rotator is configured to rotate a light emitted at the second end of the optical fiber by 22.5 degrees at room temperature.

16. The current measuring equipment according to claim 13, wherein the Faraday rotator is configured to rotate a light reflected by the mirror by 22.5 degrees at room temperature.

17. The current measuring equipment according to claim 10, wherein the sensing portion comprises a first branch wherein the linear polarizer is disposed and a second branch wherein a rotator and a second polarizer are disposed, the first and the second branch being connected to the sensing portion with a coupler.

18. The current measuring equipment according to claim 17, wherein the rotator is configured to rotate the polarization of light 45 degrees at room temperature.

19. The current measuring equipment according to claim 1, wherein the interrogator and the sensing portion are connected through only one single-mode intermediate fiber.

20. The current measuring equipment according to claim 1, wherein the sensing portion does not require a power supply source to operate.

21. A method for measuring the current circulating through a conductor with an optical based current measuring equipment comprising an interrogator that includes a light emitter and a light receiver, a sensing portion located in proximity to the conductor, and at least one single-mode intermediate fiber optically connecting the interrogator and the sensing portion, the method comprising:
  emitting from the light emitter a first polarized light pulse having a first polarization and a second polarized light pulse having a second polarization that is different from the first polarization,
  delivering the first and second polarized light pulses to the sensing portion through the at least one single-mode intermediate fiber,
  modifying the first and second polarized light pulses in the sensing portion by passing the first and second polarized light pulses through a magnetic field generated by a current passing through the conductor, and
  delivering the modified first and second polarized light pulses from the sensing portion to the light receiver via the at least one single-mode intermediate fiber, and
  determining the amount of current passing through the conductor using the modified first and second polarized light pulses received in the light receiver.

22. The method according to claim 21, wherein the first polarization and the second polarization differ by 90 degrees.

23. The method according to claim 21, wherein a time interval exists between the first and second polarized light pulses emitted by the light emitter.

24. The method according to claim 21, further comprising linearly polarizing each of the first and second polarized light pulses received in the sensing portion via the single-mode intermediate fiber.

25. The method according to claim 24, wherein the sensing portion includes a sensing section located adjacent the conductor, the method comprising rotating the polarization of the linearly polarized first and second polarized light pulses in the sensing section based on a value of the current passing through the conductor.

26. The method according to claim 25, wherein the sensing portion includes a reflective mirror located in an optical pathway downstream the sensing section, the method comprising reflecting light received from the sensing unit back into the sensing unit.

27. The method according to claim 26, wherein the sensing portion includes a Faraday rotator in which the polarization of the reflected light is modified.

28. The method according to claim 27, wherein the reflected light is rotated 22.5 degrees.

29. The method according to claim 27, wherein the reflected light is rotated 45 degrees.

* * * * *